United States Patent
Park et al.

(10) Patent No.: US 12,072,211 B2
(45) Date of Patent: Aug. 27, 2024

(54) APPARATUSES AND METHODS FOR POSITION DETECTION

(71) Applicant: Infineon Technologies AG, Neubiberg (DE)

(72) Inventors: Joo Il Park, Sungnam (KR); Dirk Hammerschmidt, Finkenstein (AT); Hyun Jeong Kim, Seoul (KR)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/542,895

(22) Filed: Dec. 6, 2021

(65) Prior Publication Data

US 2022/0196434 A1    Jun. 23, 2022

(30) Foreign Application Priority Data

Dec. 17, 2020   (DE) .......................... 102020134004.4

(51) Int. Cl.
   *G01D 5/14*   (2006.01)
   *G01R 33/09*  (2006.01)
(52) U.S. Cl.
   CPC ............. *G01D 5/145* (2013.01); *G01R 33/09* (2013.01)
(58) Field of Classification Search
   CPC .................................. G01D 5/145; G01R 33/09
   See application file for complete search history.

(56) References Cited

U.S. PATENT DOCUMENTS

| | | | |
|---|---|---|---|
| 4,401,944 A | 8/1983 | Narimatsu et al. | |
| 6,433,537 B1 | 8/2002 | Petersen | |
| 7,394,244 B2 * | 7/2008 | Schley | G01D 5/145 |
| | | | 324/207.2 |
| 8,415,946 B2 | 4/2013 | Bartos et al. | |
| 2012/0249133 A1 * | 10/2012 | Friedrich | G01R 33/091 |
| | | | 324/247 |
| 2014/0292322 A1 * | 10/2014 | Yamazaki | G01R 33/093 |
| | | | 324/252 |
| 2017/0131368 A1 | 5/2017 | Kubik et al. | |
| 2017/0212189 A1 * | 7/2017 | Holm | G01R 33/0005 |
| 2017/0276740 A1 | 9/2017 | Schmitt et al. | |

FOREIGN PATENT DOCUMENTS

| | | |
|---|---|---|
| CN | 101743456 A | 6/2010 |
| DE | 102014114920 A1 | 4/2015 |

\* cited by examiner

*Primary Examiner* — Minh Q Phan
(74) *Attorney, Agent, or Firm* — Harrity & Harrity, LLP

(57) ABSTRACT

The present disclosure relates to an apparatus for position detection, including a multipole magnet with pole pairs extending along a multipole extension direction, a magnetoresistive sensor including a first sensor bridge sensitive for a first in-plane magnetic field component and a second sensor bridge sensitive for a second in-plane magnetic field component, wherein the first sensor bridge and the second sensor bridge are arranged in-plane and are spaced apart along a sensor axis, wherein the multipole extension direction and the sensor axis are rotated by a rotation angle larger than 20° and less than 70° to each other.

19 Claims, 9 Drawing Sheets

Actual x, y bridge geometry with 45° rotated chip

APPARATUSES AND METHODS FOR POSITION DETECTION

FIELD

The present disclosure generally relates to position sensing and, more particularly, to linear position sensing using magnetoresistive angle sensors.

BACKGROUND

Linear magnetic position sensors can measure the linear movement of a multipole magnetic strip. Circular multipole magnetic rings can also be used in rotary incremental rotation off-axis applications. Magnetoresistive angle sensors typically cannot easily be used for linear magnetic position sensing as they are sensitive for in-plane magnetic field components. This means, if an magnetoresistive angle sensor including one or more magnetoresistive sensor bridge components spanning an x-y-plane, for example, the magnetoresistive sensor bridge components are merely sensitive for x- and y-magnetic field components. Multipole magnetic strips or rotating circular multipole magnetic rings which move relative to a magnetic sensor, however, typically cause a changing out-of-plane magnetic field component, while one of the two in-plane magnetic field components will be too weak to even zero. Known magnetoresistive sensor technologies are anisotropic magnetoresistance (AMR), giant magnetoresistance (GMR), tunnel magnetoresistance (TMR), colossal magnetoresistance (CMR), or extraordinary magnetoresistance (EMR). They can be summarized under the terminology xMR.

Thus, there may be a demand for using existing xMR angle sensors for linear magnetic position sensing with multipole magnets.

SUMMARY

This demand is met by apparatuses and methods in accordance with the independent claims. Some beneficial embodiments are addressed by the dependent claims.

According to a first aspect, the present disclosure proposes an apparatus for position detection. The apparatus includes a multipole magnet with pole pairs extending along a multipole extension direction. The apparatus further includes a xMR (angle) sensor including a first sensor bridge sensitive for a first in-plane magnetic field component and a second sensor bridge sensitive for a second in-plane magnetic field component. The first sensor bridge and the second sensor bridge are arranged in-plane and are spaced apart along a sensor axis. The multipole extension direction and the sensor axis are rotated by a rotation angle larger than 20° and less than 70° to each other.

By way of the rotation angle between the multipole extension direction and the sensor axis as well as the spatial separation of the first and the second sensor bridge, measurement signals of the first and the second sensor bridge may have a phase difference. This can be used to determine the motion of multipole magnet. Embodiments of the present disclosure can thus be used for both, angle- and linear motion applications.

In some embodiments, the multipole extension direction and the sensor axis are rotated by a rotation angle of 45°±5° to each other. Having a rotation angle of 45° may be beneficial since the signal components of the first and the second sensor bridge then ideally have the same amplitude, which may simplify a computational effort.

In some embodiments, the multipole extension direction corresponds to a straight line. In such embodiments, the multipole magnet is implemented as a linear multipole magnetic strip.

In other embodiments, the multipole extension direction corresponds to a circumferential direction. In such embodiments, the multipole magnet is implemented as a circular multipole magnetic ring.

In some embodiments, the multipole magnet and the xMR sensor are arranged relative to each other such that a normal to a mounting surface of (or a plane spanned by) the first and second sensor bridge is also perpendicular to a surface of the multipole magnet facing the mounting surface. Such an arrangement may yield optimum measurement results.

In some embodiments, the multipole magnet includes a linear multipole magnetic strip. The linear multipole magnetic strip and the xMR sensor may be arranged in parallel to allow for a linear relative movement between the linear multipole magnetic strip and the xMR sensor.

In some embodiments, the multipole magnet includes a circular multipole magnetic ring with pole pairs of the circular multipole magnetic ring extending along a circumferential direction. The xMR sensor may be arranged radially inside or outside the circular multipole magnetic ring to allow for a rotational relative movement between the circular multipole magnetic ring and the xMR sensor. A plane spanned by the circular multipole magnetic ring and a plane spanned by the xMR sensor may be perpendicular to each other. At the same time, the plane spanned by the multipole ring magnet and the sensor axis are rotated by a rotation angle larger than 20° and less than 70° to each other. In other words, a rotation axis of the circular multipole magnetic ring and the sensor axis are rotated by a rotation angle larger than 20° and less than 70° to each other. Again, a rotation angle of 45° may be advantageous.

In some embodiments, the apparatus further includes a processor configured to compute a relative position between the multipole magnet and the xMR sensor based on respective output signals of the first and the second sensor bridge, a pole pitch of the multipole magnet, a distance between the first and the second sensor bridge, and the rotation angle. The processor may be integrated with the xMR sensor on the same chip or may be implemented as an external device.

In some embodiments, first magnetization directions of reference layers of magnetoresistors of the first sensor bridge are orthogonal to second magnetization directions of reference layers of magnetoresistors of the second sensor bridge. For example, the first magnetization directions may be arranged to make the first sensor bridge sensitive for an x-component, the second magnetization directions may be arranged to make the second sensor bridge sensitive for a y-component of a magnetic field.

According to a further aspect, the present disclosure also proposes a method for position detection. The method includes moving a multipole magnet with pole pairs extending along a multipole extension direction relative to a xMR sensor, wherein the xMR sensor includes a first sensor bridge sensitive for a first in-plane magnetic field component and a second sensor bridge sensitive for a second in-plane magnetic field component, wherein the first sensor bridge and the second sensor bridge are arranged in-plane and are spaced apart along a sensor axis, wherein the multipole extension direction and the sensor axis are rotated by a rotation angle larger than 20° and less than 70° to each other. The method further includes computing a relative position between the multipole magnet and the xMR sensor based on respective output signals of the first and the second sensor bridge, a pole pitch of the multipole magnet, a distance between the first and the second sensor bridge, and the rotation angle.

In some embodiments, the method includes arranging the multipole magnet and the xMR sensor relative to each other such that a normal line to a mounting surface of the first and second sensor bridge is also perpendicular to a surface of the multipole magnet facing the mounting surface.

In some embodiments, the multipole magnet is a multipole strip magnet. Computing the relative position may then include computing a linear displacement between the multipole strip magnet and the xMR sensor.

In some embodiments, the multipole magnet is a multipole ring magnet. Computing the relative position may then include computing a rotation angle of the multipole strip magnet vis-à-vis the xMR sensor.

In some embodiments, the multipole extension direction and the sensor axis may be rotated by a rotation angle of 45°±5° to each other.

Embodiments of the present disclosure allow to extend xMR angle sensors to high accuracy linear position applications.

BRIEF DESCRIPTION OF THE DRAWINGS

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
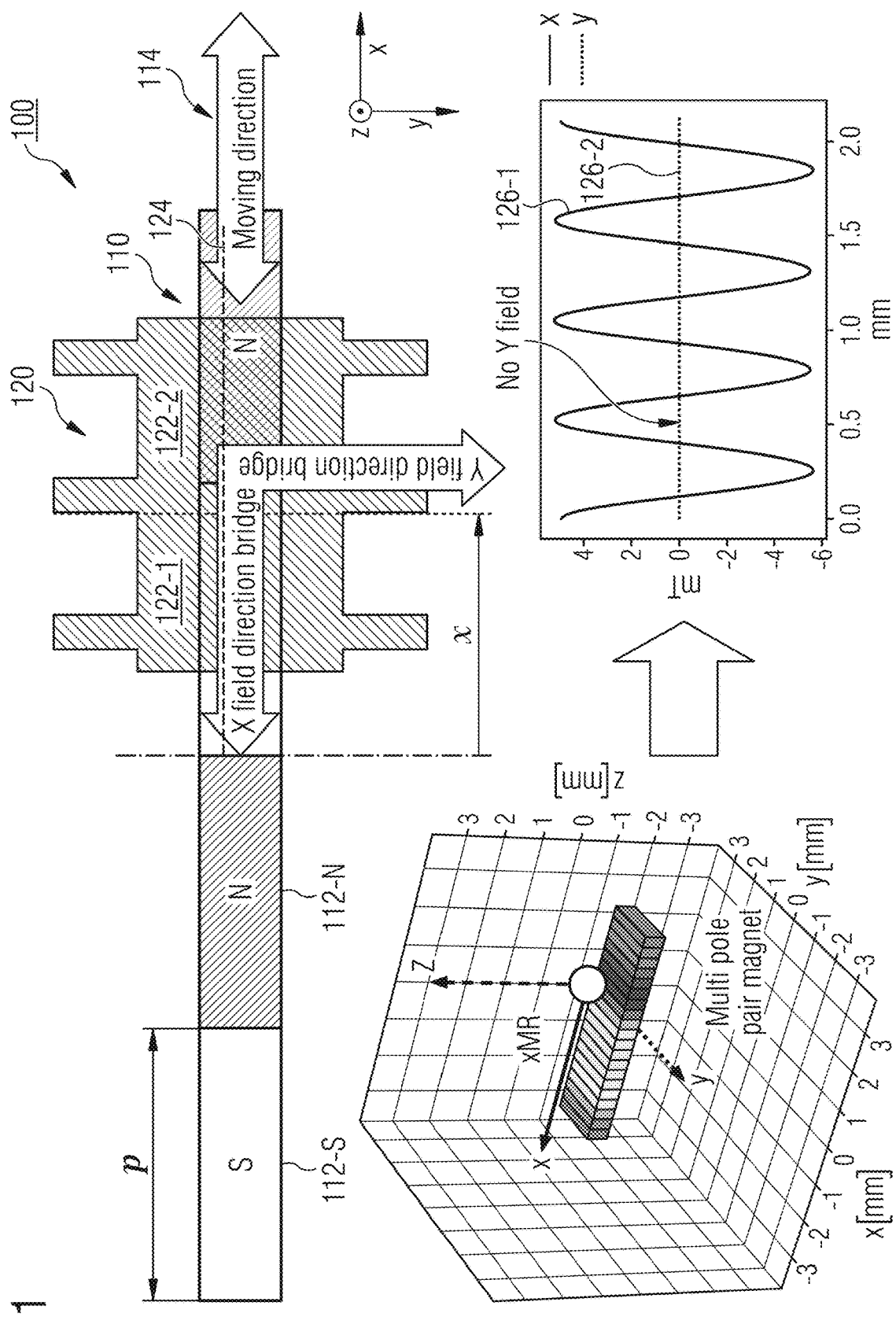
FIG. 1 shows a schematic top view of a position sensing arrangement with a multipole strip magnet an xMR sensor, where a multipole magnet extension direction and a sensor axis are not rotated to each other.

FIG. 1 shows a schematic top view of a position sensing arrangement 100 comprising a linear multipole strip magnet 110 with a plurality of pole pairs 112-S, 112-N extending along a multipole extension direction 114. In the illustrated example, the extension direction 114 corresponds to the x-direction which is also the moving or shifting direction of the multipole strip magnet 110. Magnetic south- and northpoles 112-S, 112-N of the multipole strip magnet 110 each have a width p corresponding to a pole pitch of the multipole strip magnet 110.

The position sensing arrangement 100 further comprises an xMR sensor 120 which may be arranged essentially parallel to an upper or lower surface of multipole strip magnet 110 above or below multipole strip magnet 110. Thus, the multipole strip magnet 110 and the xMR sensor 120 are arranged relative to each other such that a normal line to a surface of xMR sensor 120 is also perpendicular to a surface of the multipole strip magnet 110 facing the xMR sensor 120. In the illustrated example, multipole strip magnet 110 and xMR sensor 120 are relatively movable to each other in x-direction.

The xMR sensor 120 may be an xMR angle sensor, for example, implemented as AMR, GMR, or TMR angle sensor. The xMR sensor 120 comprises a first sensor bridge circuit 122-1 which is sensitive for a first in-plane magnetic field component, for example in x-direction. xMR sensor 120 also comprises a second sensor bridge circuit 122-2 sensitive for a second in-plane magnetic field component, for example in y-direction. The first sensor bridge circuit 122-1 and the second sensor bridge circuit 122-2 are arranged in-plane (that is, in the x-y-plane) and are spaced apart along a sensor axis 124 extending through the first sensor bridge circuit 122-1 and the second sensor bridge circuit 122-2 in x-direction. For example, the sensor bridge circuits 122-1, 122-2 may be integrated side by side on a common substrate in implemented in a common sensor chip.

Angle measurement sensors typically comprise SINE (typically named y-component) and COSINE (typically named x-component) measurement with angle calculation using the ARCTAN-function (or also named $\tan^{-1}$):

$$\hat{\alpha} = \tan^{-1}\frac{Y}{X}$$

The skilled person having benefit from the present disclosure will appreciate that magnetic field components extending from multipole strip magnet 110 through xMR sensor 120 arranged above multipole strip magnet 110 will have components in x-direction (in-plane) and z-direction (out-of-plane). In the illustrated example of FIG. 1, the sensor axis 124 is parallel to the multipole extension direction 114 (x-direction). That is, the multipole extension direction 114 and the sensor axis 124 are not rotated to each other.

In the arrangement of FIG. 1 with parallel sensor axis 124 and multipole extension direction 114, the xMR (angle) sensor 120 arranged above the multipole strip magnet 110 may only sense magnetic field components in x-direction. The xMR sensor 120 will not sense magnetic field components in y-direction. Therefore, assuming a relative linear movement between xMR sensor 120 and multipole strip magnet 110, the xMR sensor 120 will output an oscillating x-signal 126-1 but no (zero) y-signal 126-2. With a rotation angle of 0° (or 180°) between the multipole extension direction 114 and the sensor axis 124 the x-signal 126-1 and y-signal 126-2 may look as illustrated in FIG. 1, no matter whether the first sensor bridge circuit (x-bridge circuit) 122-1 and the second sensor bridge circuit (y-bridge circuit) 122-2 are spaced apart along sensor axis 124 or are located at the same position (on the sensor axis 124). Thus, the x-signal 126-1 and y-signal 126-2 generated with the sensing arrangement 100 of FIG. 1 may be useless for position or movement detection.

Figure 2:
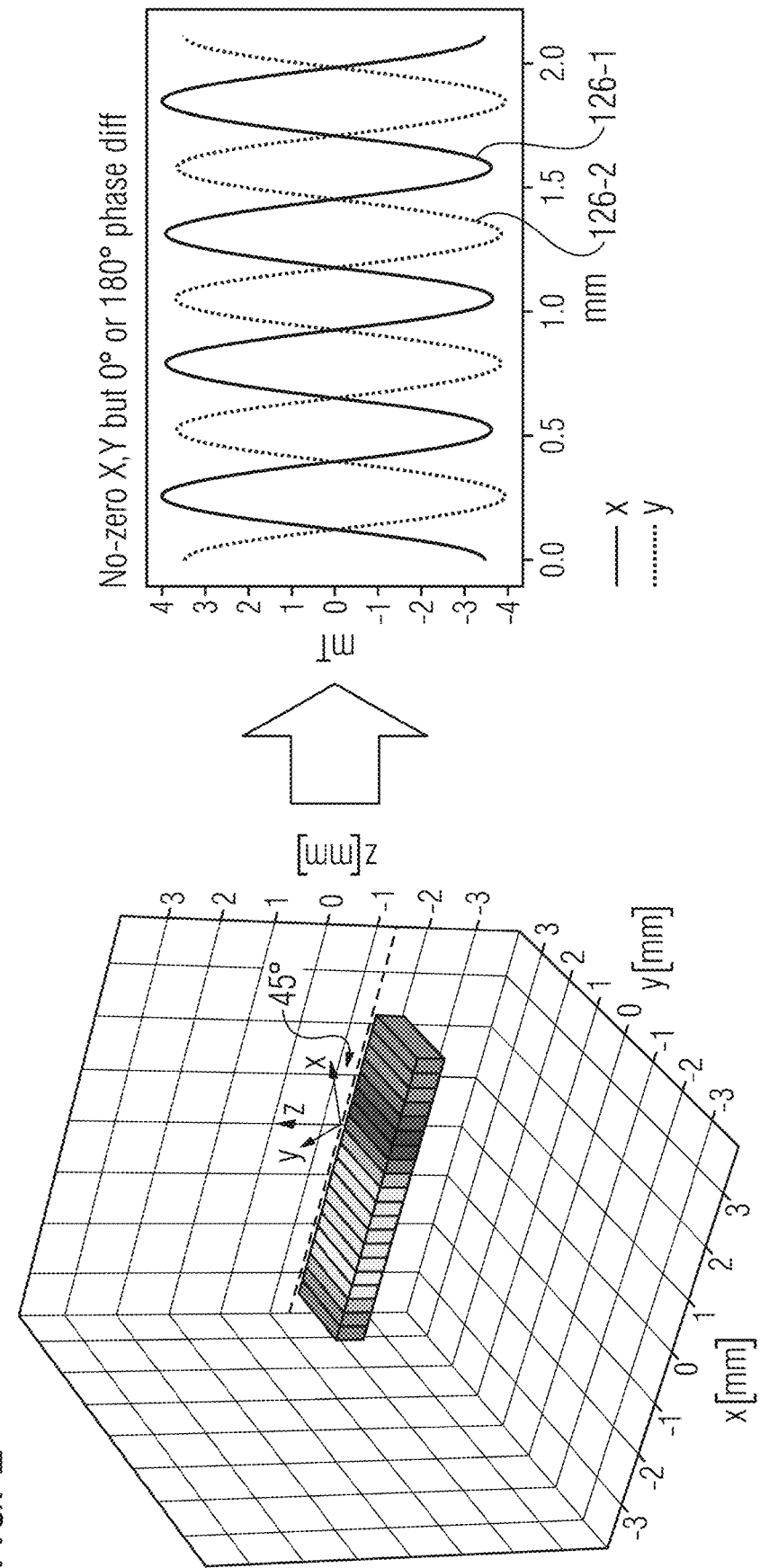
FIG. 2 shows sensor output signals for a case where the sensor axis is rotated by 45θ vis-à-vis the multipole extension direction and where the sensor bridge circuits are located at same location.

FIG. 2 shows an exemplary x-signal 126-1 and y-signal 126-2 for a case where the sensor axis 124 is rotated by ±45θ vis-à-vis the multipole extension direction (x-direction) 114 and where x-bridge circuit 122-1 and y-bridge circuit 122-2 are located at same (x, y) location (for example, stacked on top of each other) in the xMR sensor 120. The fixed rotation angle of ±45° between the multipole extension direction 114 and the sensor axis 124 leads to output signals for both the first sensor bridge circuit 122-1 and second sensor bridge circuit 122-2 ideally having the same amplitude. However, since a phase difference between x-signal 126-1 and y-signal 126-2 is either 180° or 0° for collocated sensor bridge circuits 122-1, 122-2, the x-signal 126-1 and y-signal 126-2 may still be useless for position detection.

Figure 3:
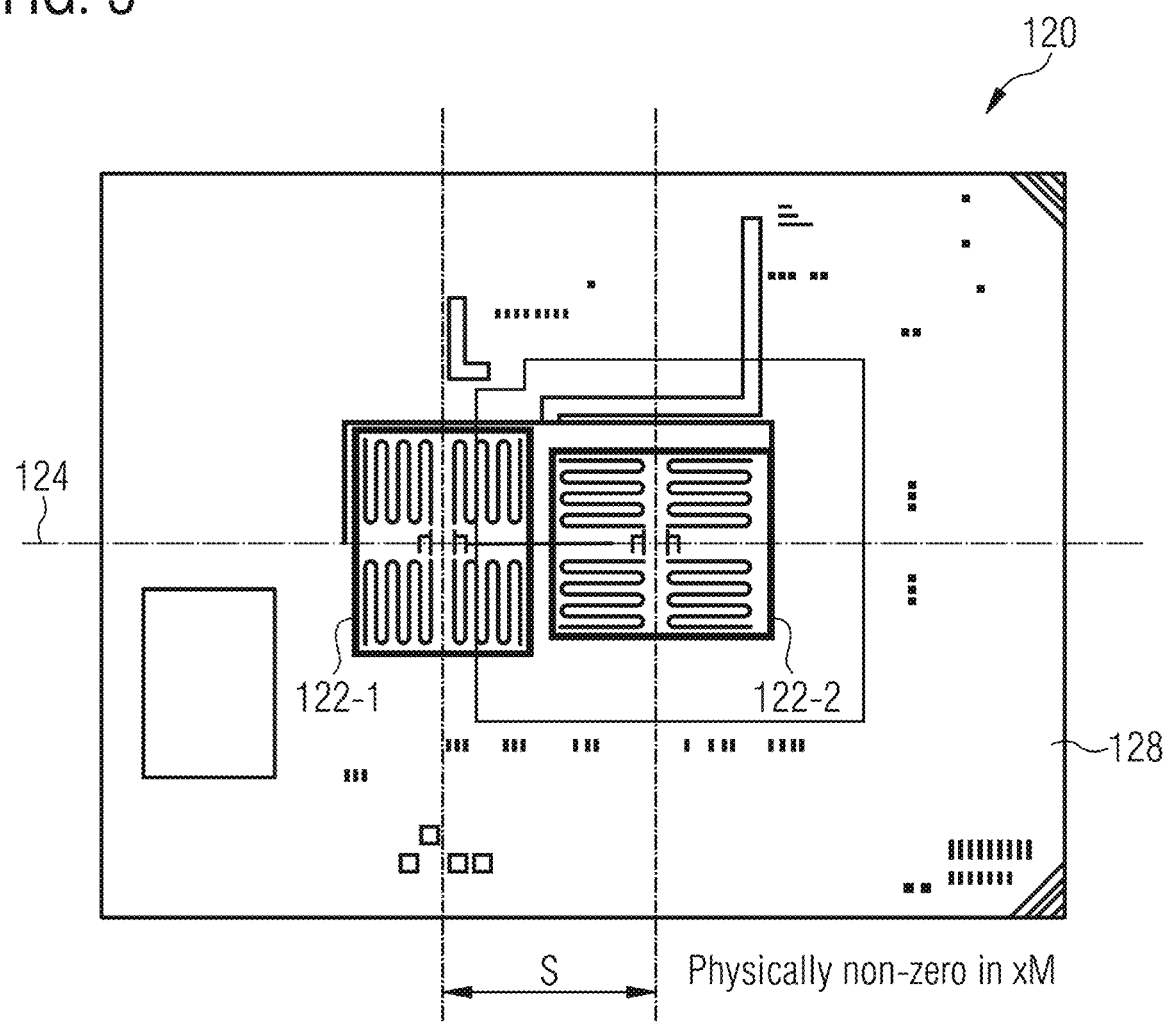
FIG. 3 shows xMR sensor comprising a first sensor bridge circuit and a second sensor bridge circuit mounted on a common planar substrate and separated by distance s.

FIG. 3 illustrates a typical implementation of an xMR (angle) sensor 120 comprising a first sensor bridge circuit 122-1 (for the x-component) and a second sensor bridge circuit 122-2 (for the y-component) mounted laterally side by side on a common planar substrate 128. As can be seen from FIG. 3, a physical distance s along the sensor axis 124 between the first sensor bridge circuit 122-1 and the second sensor bridge circuit 122-2 may be chosen to be larger than zero. Here, the first sensor bridge circuit 122-1 and the second sensor bridge circuit 122-2 are arranged in-plane on the substrate 128 and are spaced apart along sensor axis 124 by physical distance s. This physical distance s in combination with a non-zero rotation angle α between the multipole extension direction 114 and the sensor axis 124 may enable linear position detection with existing xMR angle sensors. This will be explained in further detail below.

Figure 4:
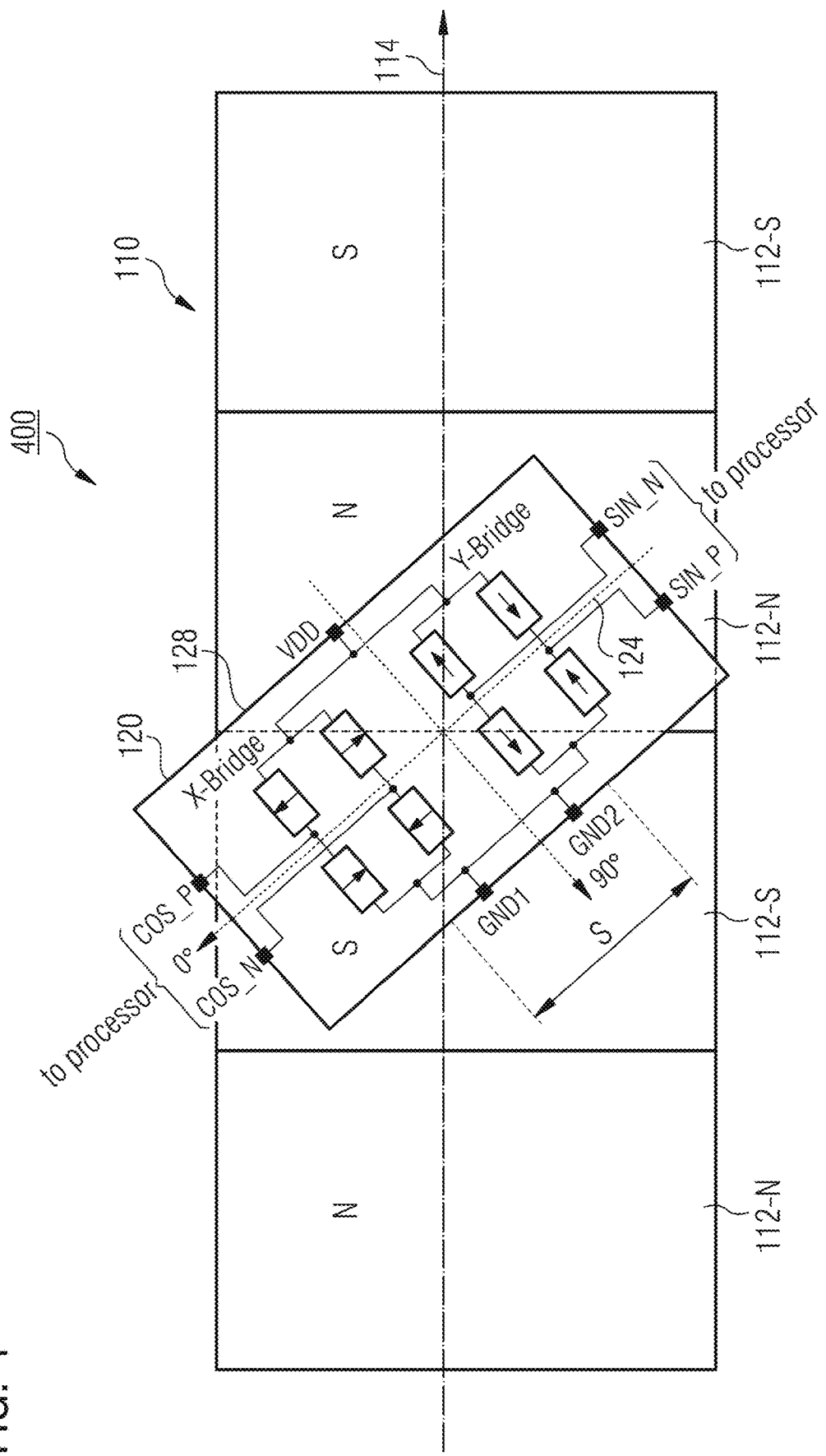
FIG. 4 shows an apparatus for position detection according to an embodiment of the present disclosure.

FIG. 4 shows an apparatus 400 for (linear) position detection according to an embodiment of the present disclosure.

Apparatus 400 comprises a multipole strip magnet 110 with pole pairs 112-S, 112-N extending along multipole extension direction 114. The multipole extension direction 114 corresponds to a longitudinal axis of the multipole strip magnet 110. Apparatus 400 further comprises an xMR (angle) sensor 120 comprising a first sensor bridge circuit (x-bridge circuit) 122-1 sensitive for a first in-plane magnetic field component (x-component) and a second sensor bridge circuit (y-bridge circuit) 122-2 sensitive for a second in-plane magnetic field component (y-component). The first sensor bridge circuit 122-1 and the second sensor bridge circuit 122-2 are configured to provide respective output signals (x- and y-signals) 126-1, 126-2 which can be used for position detection.

The first sensor bridge circuit 122-1 and the second sensor bridge circuit 122-2 may each comprise a respective Wheatstone bridge circuit with four magneto-resistors, for example. The skilled person having benefit from the present disclosure will appreciate that magnetization directions of reference layers of the magneto-resistors of the first sensor bridge circuit 122-1 are orthogonal to second magnetization directions of reference layers of magneto-resistors of the second sensor bridge circuit 122-2. The magnetization directions of reference layers may be parallel or anti-parallel to the magnetic field component which should be sensed. The magneto-resistors of the first sensor bridge circuit 122-1 are arranged in-plane on a common substrate 128 with the magneto-resistors of the second sensor bridge circuit 122-2. The respective centers of the first sensor bridge circuit 122-1 and of the second sensor bridge circuit 122-2 are spaced apart along sensor axis 124 by physical distance s. In the embodiment of FIG. 4, the multipole extension direction or the longitudinal axis 114 of the multipole strip magnet 110 and the sensor axis 124 are rotated by a fixed rotation angle α of 45°.

In general, the principles of the present invention are applicable if the rotation angle α is different from 0°, 90°, or 180° or integer multiples thereof. For example, the rotation angle α can be larger than 20° and less than 70° in some embodiments. In the setup of FIG. 4, the multipole strip magnet 110 and the xMR sensor 120 are arranged relative to each other such that a normal of the substrate 128 of the first and second sensor bridge circuits 122-1, 122-2 is also perpendicular to a surface of the multipole magnet 110 facing the substrate 128 (mounting surface).

The skilled person having benefit from the present disclosure will appreciate that an accuracy of the rotation angle α and other geometric relations described herein, may depend on manufacturing tolerances. Thus, a rotation angle of 45° also includes rotation angles slightly deviating from 45°, for example, 45°±5° or 45°±1°. A rotation angle of 45° may be beneficial because the amplitudes of the resulting output signals 126-1, 126-2 are essentially identical. A rotation angle different from 45° may be accounted for by mathematical calibration/compensation concepts, for example.

Figure 5:
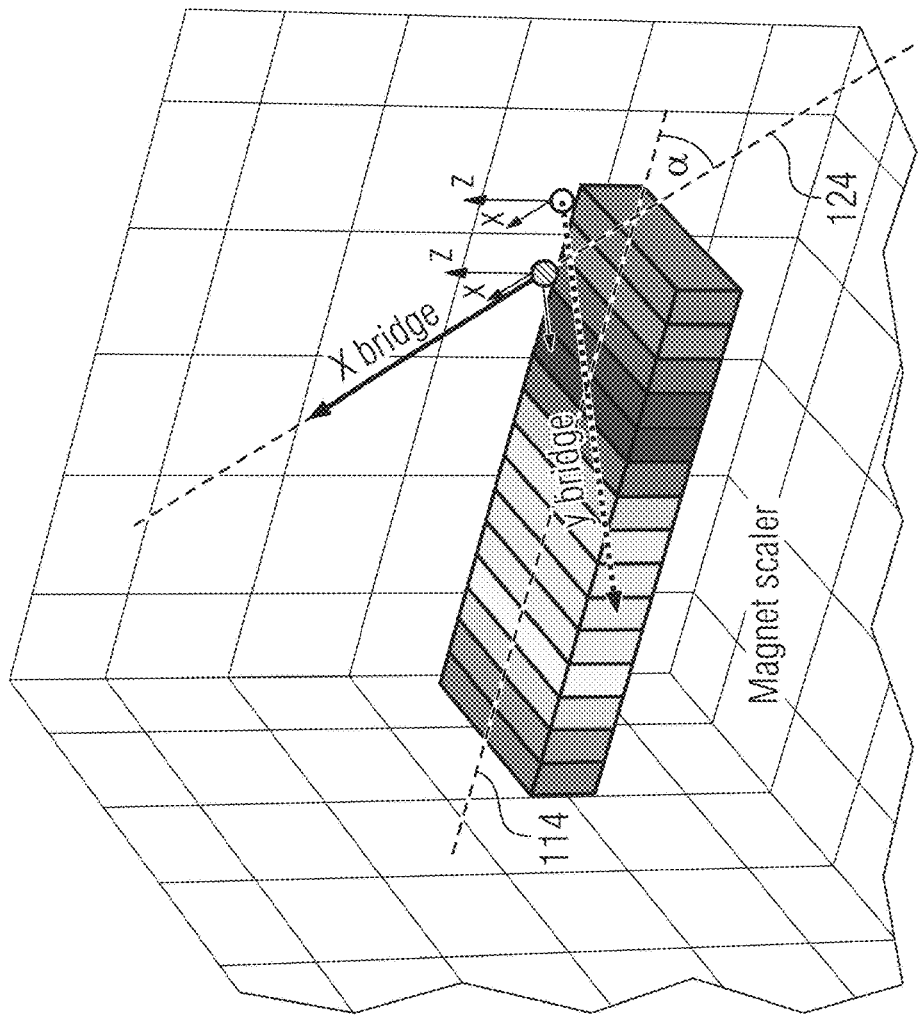
FIG. 5 shows sensor output signals for the setup of FIG. 4.
Figure 5:
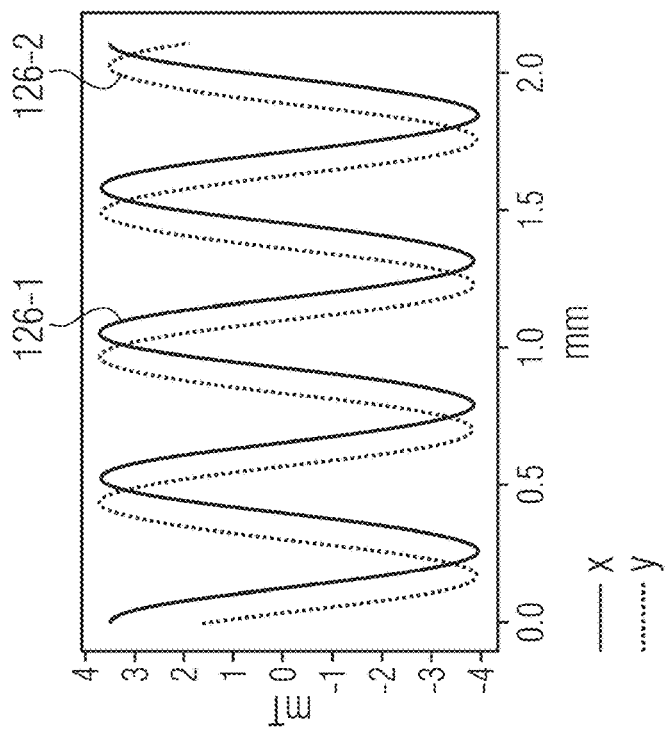

FIG. 5 shows an exemplary x-signal 126-1 and y-signal 126-2 for the position sensing setup of FIG. 4, that is, for a case where planes spanned by the multipole strip magnet 110 and the xMR sensor 120 are still parallel, but where the sensor axis 124 is rotated by 45° vis-à-vis the multipole extension direction (x-direction) 114 and where the x-bridge circuit 122-1 and the y-bridge circuit 122-2 are spaced apart along sensor axis 124 by physical distance s. The rotation angle of 45° between the multipole extension direction 114 and the sensor axis 124 together with the physical distance s leads to phase-shifted output signals 126-1, 126-2 for both the x-bridge circuit 122-1 and y-bridge circuit 122-2, the output signals 126-1, 126-2 ideally having the same amplitude. The skilled person having benefit from the present disclosure will appreciate that the rotated first sensor bridge circuit 122-1 and second sensor bridge circuit 122-2 will both sense respective projections of the x-component of the magnetic field emerging from multipole strip magnet 110 extending in x-direction.

The apparatus 400 can further comprise a processor (not shown) configured to receive the output signals 126-1, 126-2 and to compute a relative position, for example a linear shift, between the multipole magnet 110 and the xMR sensor 120 based on respective output signals 126-1, 126-2 of the first and the second sensor bridge circuits 122-1, 122-2, the pole pitch p of the multipole magnet 110, the distance s between the first and the second sensor bridge circuits 122-1, 122-2, and the fixed rotation angle α. An electrical circuit of the processor can be integrated into a common sensor chip with the first and the second sensor bridge circuits 122-1, 122-2. Alternatively, the processor can also be arranged externally from the second sensor bridge circuits 122-1, 122-2.

A relative position between the multipole magnet 110 and the xMR (angle) sensor 120 can also be expressed as an angle θ, wherein an angle of θ=2π corresponds to a relative position or movement of the multipole strip magnet 110 of ±2p. The person having benefit from the present disclosure will appreciate that existing xMR angle sensors can be used for implementing embodiments of the present disclosure. For a rotation angle α=45° between the multipole magnet 110 and the xMR sensor 120, the relative position expressed as angle θ can be determined as follows:

The output signal 126-1 of the first sensor bridge circuit 122-1 can be mathematically expressed as x=cos θ. The output signal 126-2 of the second sensor bridge circuit 122-2 can be mathematically expressed as y=cos(θ+φ), where φ=π/p*s and θ=π/p*x.

With $$\frac{x}{y} = \frac{1}{\cos\phi - \tan\theta\sin\phi},$$

the relative position θ can be determined as $$\theta = \tan^{-1}\frac{x\cos\phi - y}{x\sin\phi}$$

Figure 6:
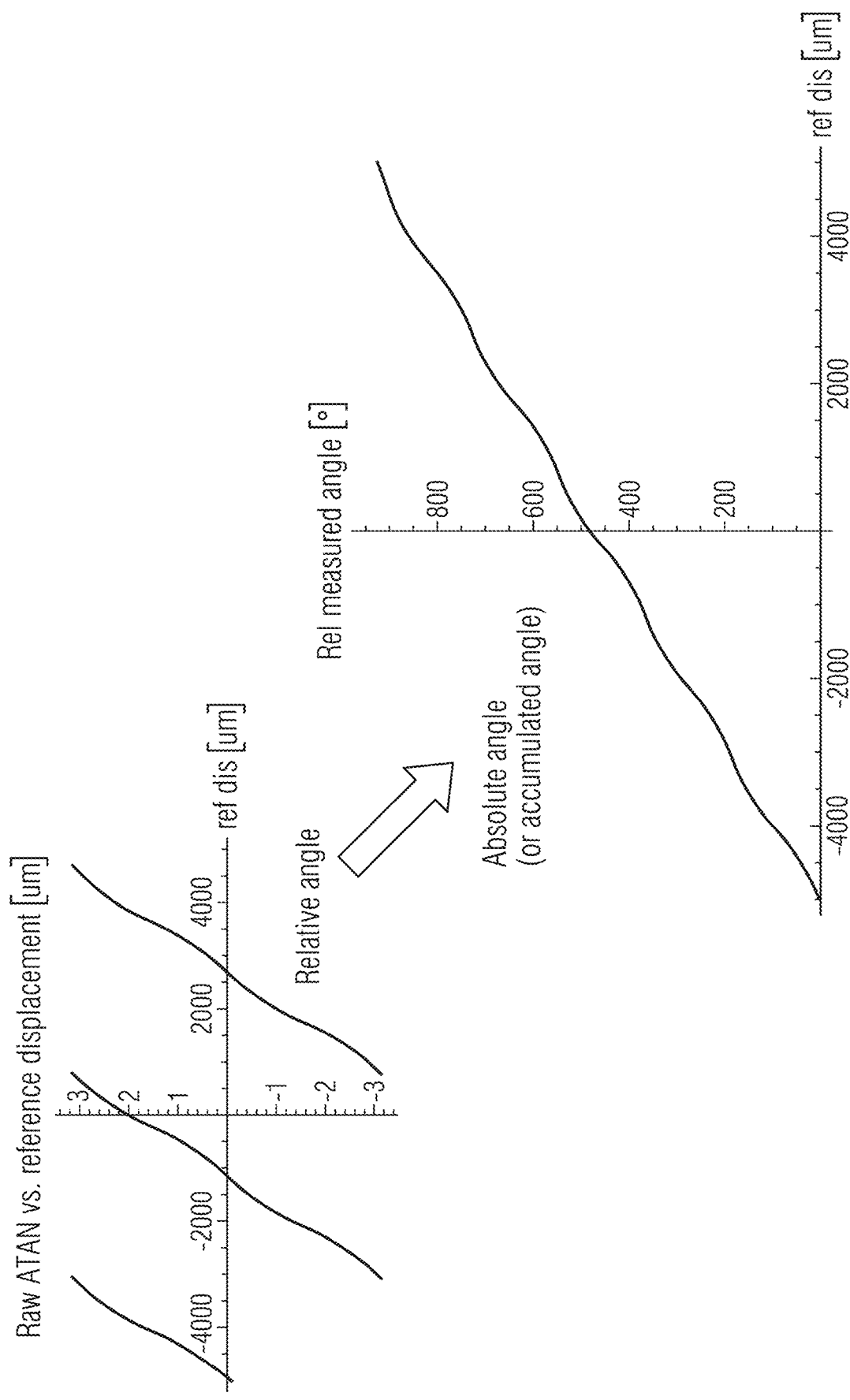
FIG. 6 shows a relative position θ which is periodic depending on the pole pitch.
Figure 7A:
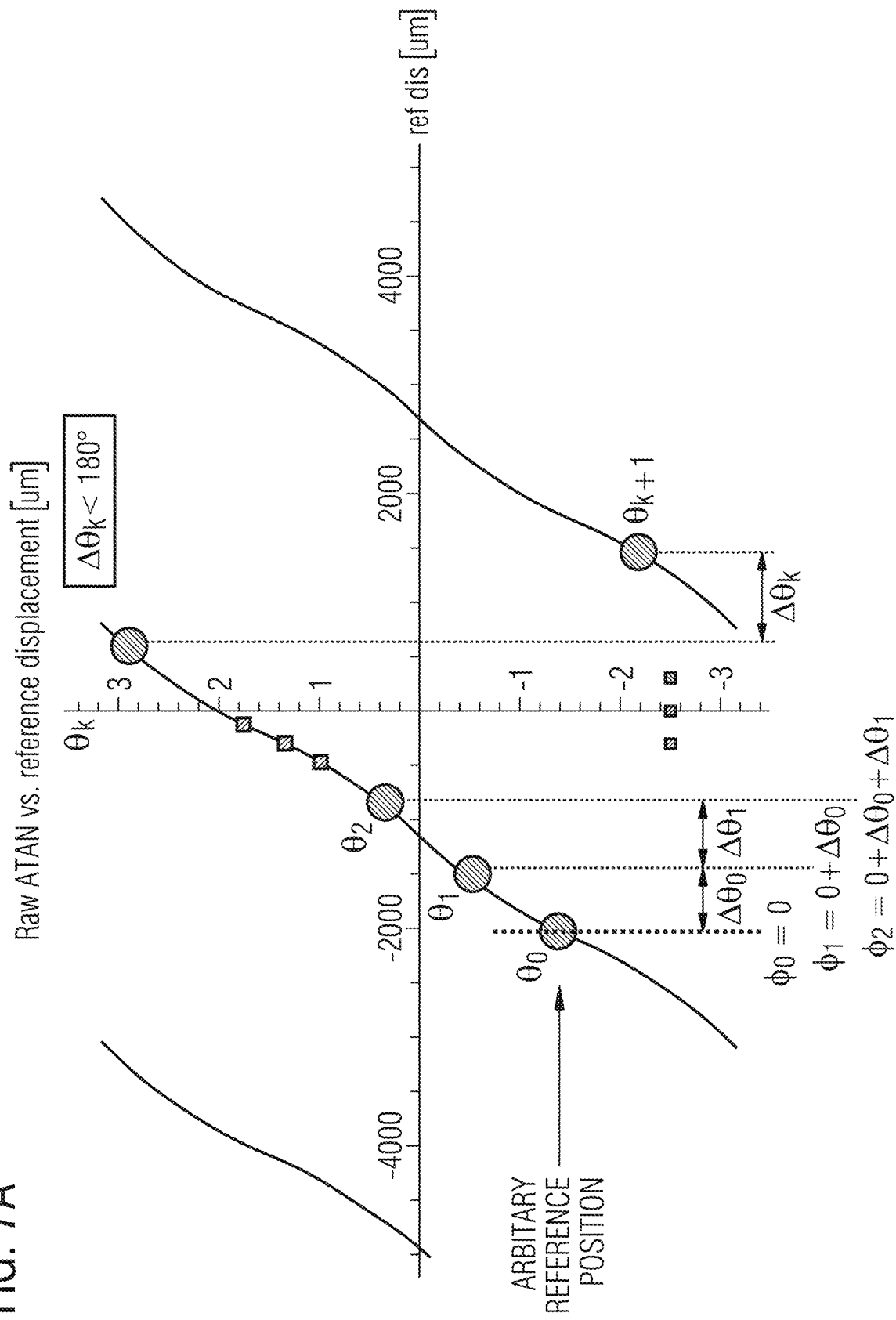
FIG. 7A illustrates an iterative process for obtaining absolute position of multipole magnet.
Figure 7B:
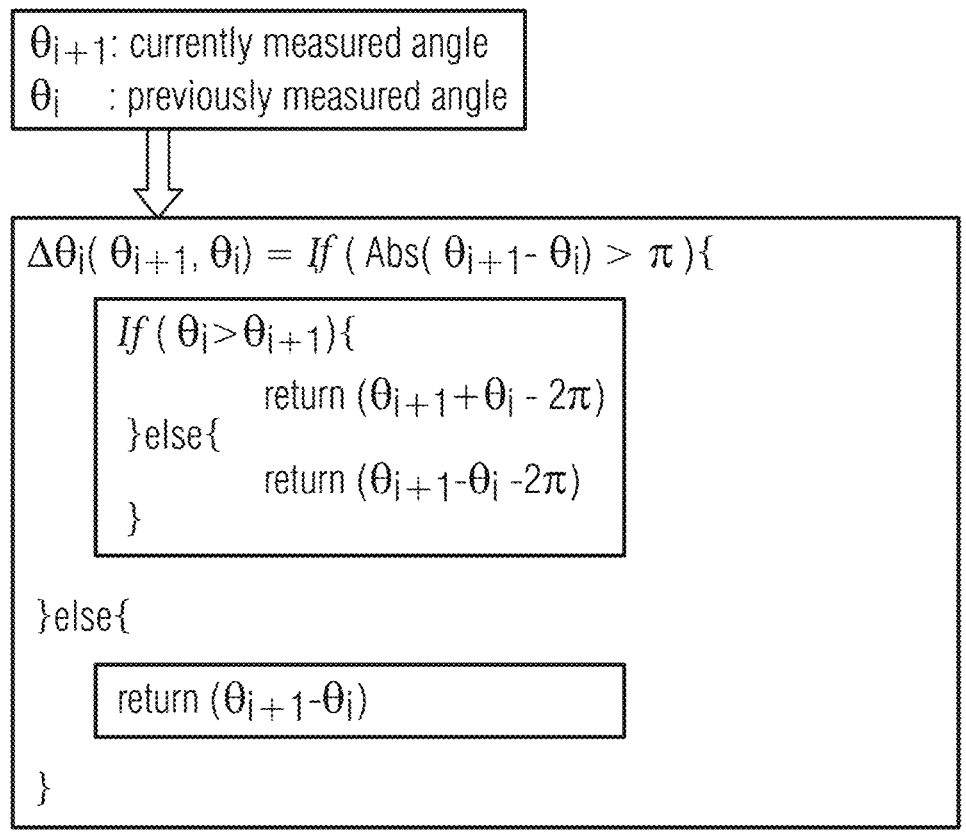
FIG. 7B illustrated a pseudo code for determining an angular increment.

As can be seen from FIG. 6, the relative position (or angle) θ may be a periodic signal depending on the pole pitch p. Thus, to obtain an absolute position (or angle) of the multipole magnet 110, the relative position θ may be iteratively accumulated to determine the absolute angular position $\phi_k$ at iteration k starting from an arbitrary reference position $\theta_0$ at iteration 0. This is shown in FIGS. 7A, B.

The accumulated angle $$\phi_k = \sum_{i=0}^{k} \Delta\theta_i$$

$$\Delta\theta_i < \pi, k = 0, 1, 2, \ldots$$

may be converted to an absolute (linear) position by absolute position=$2p/2\pi*\phi_k$.

The skilled person having benefit from the present disclosure will appreciate that a measurement accuracy may depend on various factors, such as, for example, a quality of employed analog-to-digital converters (ADCs) used to convert the x-signal 126-1 and y-signal 126-2 from the analog to the digital domain.

The proposed principle may not only be used for position sensing of multipole strip magnets but also for position sensing in conjunction with multipole ring magnets.

Figure 8:
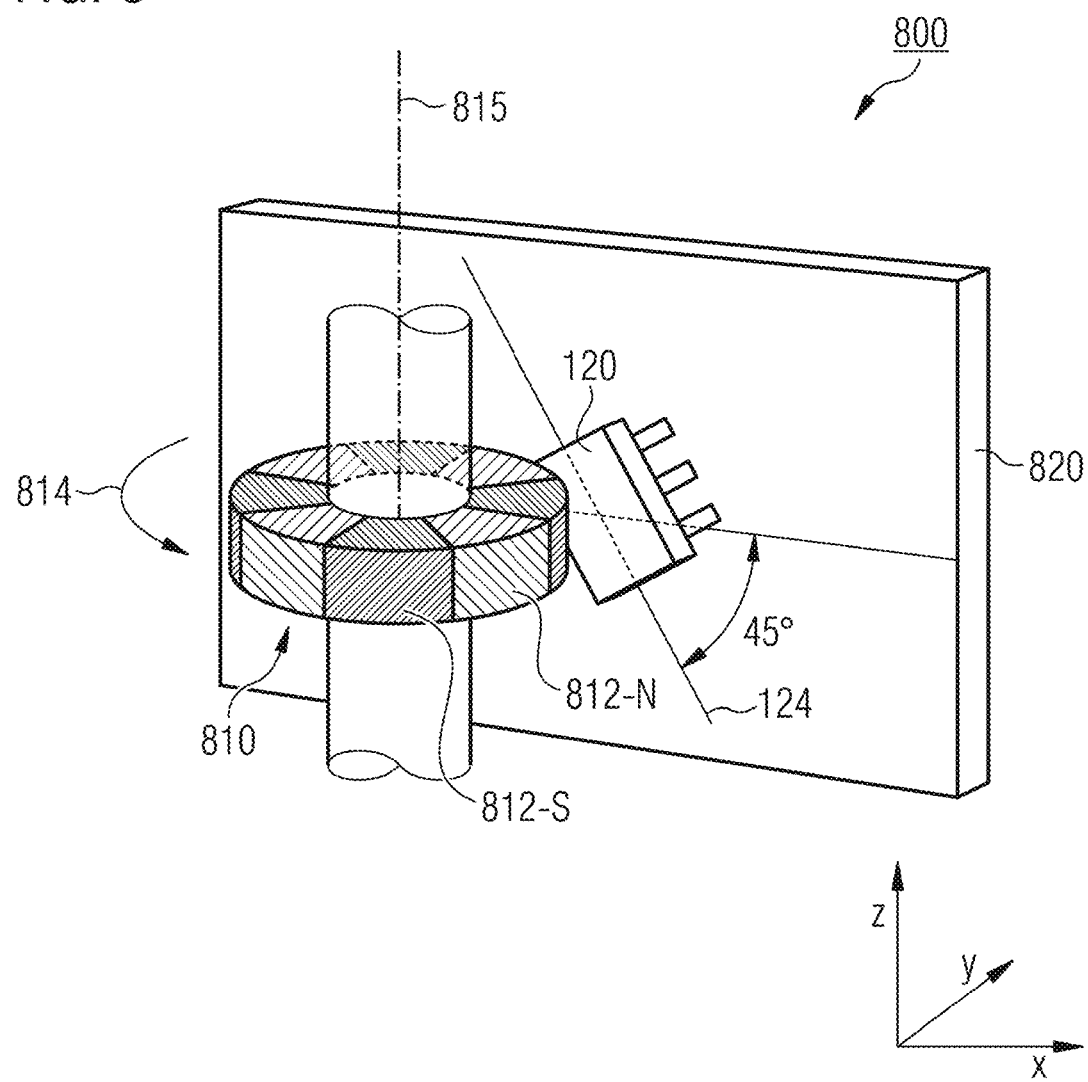
FIG. 8 shows an apparatus for position detection according to a further embodiment of the present disclosure.

FIG. 8 shows a further embodiment 800 of the present disclosure, where the multipole magnet is implemented as a multipole ring magnet 810 with pole pairs 812-S, 812-N extending along a circumferential direction 814 around a rotation axis 815 of the multipole ring magnet 810. In the illustrated embodiment, the xMR sensor 120 is arranged radially outside the multipole ring magnet 810 to allow for a rotational relative movement between the multipole ring magnet 810 and the xMR sensor 120. A (x-y-) plane spanned by the multipole ring magnet 810 extends through the xMR sensor. The (x-y-) plane spanned by the multipole ring magnet 810 and a (x-z-) plane 820 spanned by the xMR sensor 120 are perpendicular to each other. Further, the (x-y-) plane spanned by the multipole ring magnet 810 and the sensor axis 124 of the xMR sensor 120 are rotated by a rotation angle which can be larger than 20° and less than 70°. In a preferred embodiment the rotation angle is 45°.

Embodiments of the present disclosure allow to extend existing xMR angle sensors to high accuracy linear or rotational position applications. For this purpose it is proposed to move a multipole magnet 110, 810 with pole pairs extending along a multipole extension direction 114; 814 relatively to a magnetoresistive sensor 120, wherein the magnetoresistive sensor 120 comprises a first sensor bridge 122-1 sensitive for a first in-plane magnetic field component and a second sensor bridge 122-2 sensitive for a second in-plane magnetic field component, wherein the first sensor bridge and the second sensor bridge are arranged in-plane and are spaced apart along a sensor axis 124. The multipole extension direction 114, 814 and the sensor axis 124 are rotated by a rotation angle larger than 20° and less than 70° to each other. A relative position between the multipole magnet 110; 810 and the magnetoresistive sensor 120 is computed based on respective output signals 126-1, 126-2 of the first and the second sensor bridge, a pole pitch of the multipole magnet, a distance between the first and the second sensor bridge, and the rotation angle.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. An apparatus for position detection, comprising:
a multipole magnet comprising a plurality of pole pairs extending along a multipole extension direction;
a magnetoresistive sensor comprising a first sensor bridge that is sensitive to a first in-plane magnetic field component and that is electrically coupled to a second sensor bridge that is sensitive to a second in-plane magnetic field component,
wherein the first sensor bridge is a first full Wheatstone bridge configured to generate a first pair of output signals corresponding to the first in-plane magnetic field component and the second sensor bridge is a second full Wheatstone bridge configured to generate a second pair of output signals corresponding to the second in-plane magnetic field component,
wherein the first pair of output signals are phase-shifted with respect to the second pair of output signals,
wherein the first sensor bridge and the second sensor bridge are arranged in-plane and are positioned along a same sensor axis of the magnetoresistive sensor,
wherein the first sensor bridge and the second sensor bridge are separated by a distance along the same sensor axis,
wherein the first sensor bridge includes a first set of magnetoresistors and the second sensor bridge includes a second set of magnetoresistors,
wherein first magnetization directions of reference layers of the first set of magnetoresistors are parallel to the same sensor axis and are orthogonal to second magnetization directions of reference layers of the second set of magnetoresistors, and
wherein the multipole extension direction and the same sensor axis are rotated by a rotation angle larger than 20° and less than 70° with respect to each other; and
a processor configured to:
determine a relative linear position between the multipole magnet and the magnetoresistive sensor based on the first set of output signals and the second set of output signals, wherein no magnetoresistive sensor signals other than the first set of output signals and the second set of output signals are used for calculating the relative linear position between the multipole magnet and the magnetoresistive sensor.

2. The apparatus of claim 1, wherein the multipole extension direction and the same sensor axis are rotated by a rotation angle of 45°±5° with respect to each other, and
wherein an amplitude of the first pair of output signals is substantially the same as an amplitude of the second pair of output signals.

3. The apparatus of claim 1, wherein the multipole extension direction corresponds to a straight line or a circumferential direction.

4. The apparatus of claim 1, wherein multipole magnet and the magnetoresistive sensor are arranged relative to each other such that a normal to a mounting surface of the first sensor bridge and the second sensor bridge is perpendicular to a surface of the multipole magnet facing the mounting surface.

5. The apparatus of claim 1, wherein the multipole magnet is a multipole strip magnet with the plurality of pole pairs extending in a linear direction, and wherein the multipole strip magnet and the magnetoresistive sensor are arranged in parallel to allow for a linear relative movement between the multipole strip magnet and the magnetoresistive sensor.

6. The apparatus of claim 1, wherein the multipole magnet is a multipole ring magnet with the plurality of pole pairs of the multipole ring magnet extending along a circumferential direction,
wherein the magnetoresistive sensor is arranged radially outside the multipole ring magnet to allow for a rotational relative movement between the multipole ring magnet and the magnetoresistive sensor,
wherein a plane spanned by the multipole ring magnet and a plane spanned by the magnetoresistive sensor are perpendicular to each other, and
wherein the plane spanned by the multipole ring magnet and the same sensor axis are rotated by a rotation angle larger than 20° and less than 70° with respect to each other.

7. The apparatus of claim 1, wherein the processor is configured to compute the relative linear position between the multipole magnet and the magnetoresistive sensor further based on a pole pitch of the multipole magnet, a distance between the first sensor bridge and the second sensor bridge, and the rotation angle.

8. The apparatus of claim 1, wherein the processor, when iteratively determining the relative linear position, is configured to:
iteratively determine relative linear positions between the multipole magnet and the magnetoresistive sensor; and
wherein the processor is further configured to:
determine an actual position between the multipole magnet and the magnetoresistive sensor based on the iteratively determined relative linear positions between the multipole magnet and the magnetoresistive sensor.

9. The apparatus of claim 1, wherein the first magnetization directions of reference layers of the first set of magnetoresistors are anti-parallel to the first in-plane magnetic field component and the second magnetization directions of reference layers of the second set of magnetoresistors are anti-parallel to the second in-plane magnetic field component.

10. A method for position detection, comprising:
moving a multipole magnet relative to a magnetoresistive sensor, wherein the multipole magnet comprises a plurality of pole pairs that extend along a multipole extension direction,
wherein the magnetoresistive sensor comprises a first sensor bridge that is sensitive to a first in-plane magnetic field component and that is electrically coupled to a second sensor bridge that is sensitive to a second in-plane magnetic field component,
wherein the first sensor bridge is a first full Wheatstone bridge and the second sensor bridge is a second full Wheatstone bridge,
wherein the first sensor bridge and the second sensor bridge are arranged in-plane and are positioned along a same sensor axis of the magnetoresistive sensor,
wherein the first sensor bridge and the second sensor bridge are separated by a distance along the same sensor axis,
wherein the first sensor bridge includes a first set of magnetoresistors and the second sensor bridge includes a second set of magnetoresistors,
wherein first magnetization directions of reference layers of the first set of magnetoresistors are parallel to the same sensor axis and are orthogonal to second magnetization directions of reference layers of the second set of magnetoresistors, and
wherein the multipole extension direction and the same sensor axis are rotated by a rotation angle larger than 20° and less than 70° with respect to each other;
iteratively computing relative linear positions between the multipole magnet and the magnetoresistive sensor based on respective output signals of the first sensor bridge and the second sensor bridge, a pole pitch of the multipole magnet, a distance between the first sensor bridge and the second sensor bridge, and the rotation angle,
wherein output signals of the first sensor bridge are phase-shifted with respect to output signals of the second sensor bridge, and
wherein no magnetoresistive sensor signals other than the respective output signals of the first sensor bridge and the second sensor bridge are used for calculating the relative linear positions between the multipole magnet and the magnetoresistive sensor; and
computing an actual linear position between the multipole magnet and the magnetoresistive sensor based on the iteratively computed relative linear positions.

11. The method of claim 10, further comprising:
arranging the multipole magnet and the magnetoresistive sensor relative to each other such that a normal line to a mounting surface of the first sensor bridge and the second sensor bridge is perpendicular to a surface of the multipole magnet facing the mounting surface.

12. The method of claim 10, wherein the multipole magnet is a multipole ring magnet with the plurality of pole pairs of the multipole ring magnet extending along a circumferential direction, and
wherein iteratively computing the relative linear positions includes iteratively computing a rotation angle of the multipole ring magnet relative to the magnetoresistive sensor.

13. The method of any one of claim 10, wherein the multipole extension direction and the same sensor axis are rotated by a rotation angle of 45°±5° with respect to each other.

14. A magnetoresistive sensor comprising:
a first sensor bridge circuit; and
a second sensor bridge circuit that is electrically coupled to the first sensor bridge circuit,
wherein the first sensor bridge circuit is a first full Wheatstone bridge configured to generate a first pair of output signals corresponding to a first in-plane magnetic field component and the second sensor bridge circuit is a second full Wheatstone bridge configured to generate a second pair of output signals corresponding to a second in-plane magnetic field component, wherein the first pair of output signals are phase-shifted with respect to the second pair of output signals, wherein a relative linear position between a multipole magnet and the magnetoresistive sensor is determined based on the first set of output signals and the second set of output signals, wherein no magnetoresistive sensor signals other than the first set of output signals and the second set of output signals are used for calculating the relative linear position between the multipole magnet and the magnetoresistive sensor, wherein the first sensor bridge circuit and the second sensor bridge circuit are arranged in-plane and are positioned along a same sensor axis of the magnetoresistive sensor, wherein the first sensor bridge and the second sensor bridge are separated by a distance along the same sensor axis, wherein the first sensor bridge circuit includes a first set of magnetoresistors and the second sensor bridge circuit includes a second set of magnetoresistors, wherein first magnetization directions of reference layers of the first set of magnetoresistors are parallel to the same sensor axis and are orthogonal to second magnetization directions of reference layers of the second set of magnetoresistors, and wherein the same sensor axis is rotated by a rotation angle larger than 20° and less than 70° with respect to a multipole extension direction defined by a plurality of pole pairs of the multipole magnet.

15. The magnetoresistive sensor of claim 14, wherein the multipole extension direction and the same sensor axis are rotated by a rotation angle of 45°±5° with respect to each other, and wherein an amplitude of the first pair of output signals is substantially the same as an amplitude of the second pair of output signals.

16. The magnetoresistive sensor of claim 14, wherein the multipole extension direction corresponds to a straight line or a circumferential direction.

17. The magnetoresistive sensor of claim 14, wherein multipole magnet and the magnetoresistive sensor are arranged relative to each other such that a normal to a mounting surface of the first sensor bridge circuit and the second sensor bridge circuit is perpendicular to a surface of the multipole magnet facing the mounting surface.

18. The magnetoresistive sensor of claim 14, wherein the multipole magnet is a multipole strip magnet with the plurality of pole pairs extending in a linear direction, and wherein the multipole strip magnet and the magnetoresistive sensor are arranged in parallel to allow for a linear relative movement between the multipole strip magnet and the magnetoresistive sensor.

19. The magnetoresistive sensor of claim 14, wherein the multipole magnet is a multipole ring magnet with the plurality of pole pairs of the multipole ring magnet extending along a circumferential direction, wherein the magnetoresistive sensor is arranged radially outside the multipole ring magnet to allow for a rotational relative movement between the multipole ring magnet and the magnetoresistive sensor, wherein a plane spanned by the multipole ring magnet and a plane spanned by the magnetoresistive sensor are perpendicular to each other, and wherein the plane spanned by the multipole ring magnet and the same sensor axis are rotated by a rotation angle larger than 20° and less than 70° with respect to each other.

* * * * *